(12) United States Patent
Chainer et al.

(10) Patent No.: US 10,701,839 B2
(45) Date of Patent: Jun. 30, 2020

(54) SERVER COOLING SYSTEM WITHOUT THE USE OF VAPOR COMPRESSION REFRIGERATION

(71) Applicant: International Business Machines Corporation, Armonk, NY (US)

(72) Inventors: Timothy J. Chainer, Putnam Valley, NY (US); Pritish R. Parida, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 355 days.

(21) Appl. No.: 15/663,739

(22) Filed: Jul. 29, 2017

(65) Prior Publication Data

US 2017/0354058 A1   Dec. 7, 2017

Related U.S. Application Data

(62) Division of application No. 13/856,381, filed on Apr. 3, 2013, now Pat. No. 9,801,310.

(51) Int. Cl.
*H05K 7/20*   (2006.01)

(52) U.S. Cl.
CPC ................... *H05K 7/2079* (2013.01)

(58) Field of Classification Search
CPC .......... H05K 7/2079; H05K 7/20781
USPC ............................. 454/184; 703/1
See application file for complete search history.

(56) References Cited

U.S. PATENT DOCUMENTS

| | | | |
|---|---|---|---|
| 6,609,213 B1 | 8/2003 | Nguyen et al. | 714/4.12 |
| 7,724,524 B1 | 5/2010 | Campbell et al. | 361/701 |
| 2007/0227710 A1* | 10/2007 | Belady | H05K 7/2079 165/122 |
| 2010/0317279 A1 | 12/2010 | Yatskov | 454/184 |
| 2011/0315353 A1 | 12/2011 | Campbell et al. | 165/104.31 |
| 2012/0006038 A1 | 1/2012 | Sharma | 62/97 |
| 2012/0142265 A1 | 6/2012 | Wei | 454/184 |
| 2013/0048266 A1* | 2/2013 | Bauchot | H05K 7/20836 165/299 |
| 2013/0231038 A1 | 9/2013 | Chang | 454/184 |
| 2013/0267161 A1 | 10/2013 | Iqbal | 454/184 |

FOREIGN PATENT DOCUMENTS

| | | | |
|---|---|---|---|
| CN | 100585841 | 3/2004 | G06F 1/20 |
| CN | 1658124 | 8/2005 | F25D 9/00 |
| CN | 1729734 | 2/2006 | H05K 7/10 |
| CN | 101645816 | 2/2010 | H04L 12/28 |
| EP | 1283475 | 2/2003 | G06F 1/16 |
| JP | 2005229036 | 8/2005 | F25D 1/00 |

* cited by examiner

*Primary Examiner* — Edelmira Bosques
*Assistant Examiner* — Dana K Tighe
(74) *Attorney, Agent, or Firm* — Ido Tuchman; Daniel P. Morris

(57) ABSTRACT

A system, method, and computer product for cooling a server center without the use of vapor compression refrigeration. An example embodiment involves using outdoor ambient air to cool first server components directly and to cool heat exchanges containing liquid used to cool second server components.

6 Claims, 5 Drawing Sheets

SERVER COOLING SYSTEM WITHOUT THE USE OF VAPOR COMPRESSION REFRIGERATION

CROSS-REFERENCE TO RELATED APPLICATIONS

This application is a divisional application claiming priority under 35 U.S.C. § 120 to U.S. patent application Ser. No. 13/856,381 filed Apr. 3, 2013, the entire text of which is specifically incorporated by reference herein.

BACKGROUND

This invention relates to data center cooling, and more particularly to a system and a method to increase cooling efficiency without the use of vapor compression refrigeration.

The energy consumed by data centers has doubled over the past six year and is predicted to keep increasing at the same rate. Up to forty percent of the power consumed by data centers is used to cool them to an optimum operating temperature. Current systems using vapor compression refrigeration require significant amounts of energy to operate.

Recent trends to reduce energy have resulted in systems using only liquid circulation to transfer the heat out of the server. These systems pump the liquid containing heat from the servers through outdoor heat exchangers that allow the heat to dissipate into the outdoor air. The cool liquid is circulated back into to server where it is used to cool the air circulating in the server and to directly cool server components. However, these systems still require large amount of power to operate the pump and fans.

BRIEF SUMMARY

Accordingly, one example aspect of the present invention is a system for cooling a data center. This system includes fans that form an air cooling path to cool a first set of server components and a pump circulating a liquid to cool a second set of server components. The first set of components is cooled by convection to outdoor ambient air. This is accomplished by passing the outdoor ambient air over the first set of server components. The second set of server components is cooled by direct thermal conduction into the liquid. The liquid is cooled by flowing outdoor ambient air over a heat exchanger containing the heated liquid. This is all accomplished without the use of vapor compression refrigeration.

Another example of the present invention is a method for cooling a data center. The method includes forming an air cooling path to cool a first set of server components and circulating a liquid to cool a second set of server components. The air cooling path passes outdoor ambient air over the first set of server components to cool them by convection. The circulating liquid cools the second set of server components by direct thermal conduction into the liquid. The liquid is cooled without the use of vapor compression refrigeration, by flowing outdoor ambient air over a heat exchanger containing the heated liquid.

Yet a further example of the invention is a computer program product for cooling a server center. The computer program product includes computer readable program code configured to form an air cooling path to cool a first set of server components by convection to outdoor ambient air and to circulate a liquid to cool a second set of server components. The air cooling path uses convection to cool the first set of server components by passing outdoor ambient air over them. The circulated liquid cools the second set of server components through direct thermal conduction into the liquid. The liquid is cooled by flowing outdoor ambient air over a heat exchanger containing the heated liquid with use of vapor compression refrigeration.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
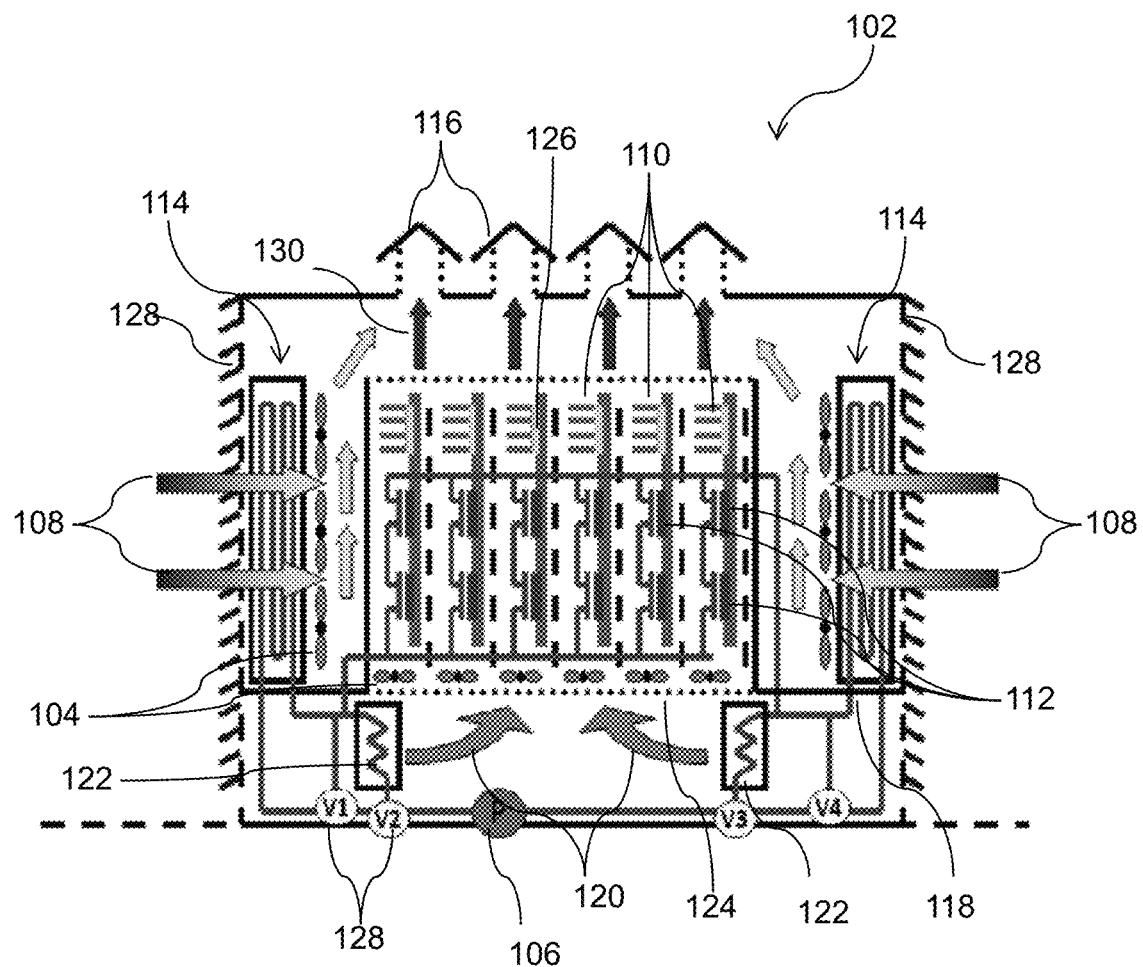
FIG. 1 shows a cross-sectional view of an example of the server cooling center according to one embodiment of the present invention.

The present invention is described with reference to embodiments of the invention. Throughout the description of the invention reference is made to FIGS. 1-5. When referring to the figures, like structures and elements shown throughout are indicated with like reference numerals.

Embodiments of the present invention use an air cooling path and a circulating liquid for cooling a server center. The air cooling path cools a first set of server components by convection to outdoor ambient air by passing the outdoor ambient air over the first server components. The circulating liquid cools a second set of server components through direct thermal conduction into the liquid. The liquid is cooled by flowing outdoor ambient air over a heat exchanger without the use of a vapor compression refrigeration unit.

FIG. 1 shows a cross-sectional view of an embodiment of the server cooling center 102 according to the present invention. The server cooling center 102 includes multiple fans 104 and a pump 106. As used herein, a "fan" is any device that can create airflow. A "pump" as used in this application refers to any device that can generate liquid flow. The fans 104 form an air cooling path 108, 120 pulling outdoor ambient air into the server cooling center 102. The air cooling path 120 cools the first server components 110 by convention to air. The pump 106 circulates a liquid coolant to cool second server components 112 through direct thermal conduction into the liquid coolant. This liquid coolant is cooled by flowing outdoor ambient air over a heat exchanger 114 containing the liquid. The liquid coolant is cooled without the use of vapor compression refrigeration.

This system will be most effective if the first server components 110 are the components that produce less heat such as hard drives, power modules, and other miscellaneous server products. The second server components 112 should be components creating the most heat such as CPUs and memory modules.

The specific embodiment shown in FIG. 1 has multiple sidewalls 128. Each sidewall has a first side exposed to the outdoor ambient air, and a second side facing the first server components 110 and the second server components 112. The sidewalls 128 have openings creating fluid continuity with the first and second side. This allows outdoor ambient air to enter the cooling center 102. Air filters and louvers can be used to weather guard and control air flow through the openings. Multiple chimneys 116 allow the heated air 130 to flow out of the cooling center 102.

An embodiment of the present invention may have a raised floor 118. Air 120 entering below the raised floor 118 is channeled to the first server components 110. Air 108 entering above the raised floor 118 is channeled to the heat exchangers 114 containing the liquid cooling the second server components 112. Air warming heat exchangers 122 containing the liquid used to cool the second server components 112 can be positioned below the raised floor 118 in the air cooling path 108 to heat cold air that could cause condensation when heated in the server center.

The server racks 124 in the server cooling center holding the first server components 110 and second server components 112 can be perforated to allow the air to flow over the first server components 110. Server shelves 126 may be positioned horizontal to the airflow path to facilitate airflow.

One embodiment of the present invention can use valves 128 to control flow of the liquid coolant circulating through the system. If the outdoor ambient air is warm, the valves direct liquid coolant through all the heat exchanges 114 to maximizing cooling. If the outdoor ambient air is cold, valves may direct the liquid coolant through a portion of the heat exchangers 114 necessary to cool the servers. The valves 128 can also flow warm liquid coolant through the air heating heat exchangers 122 to warm the entering air.

One advantage of the configuration described above is that both the air loop and the liquid coolant loop have a shorter thermal resistance path from the server to the outdoor ambient. Thus, the cooling system would be highly efficient. The temperature of the air in the air cooling path and the circulated liquid may be as low as the outdoor ambient temperature or a couple degrees Celsius above the outdoor ambient temperature.

Implementation of the inventive system described herein to an existing liquid cooled data center may require either the restructuring/replacing of some hardware components or use of new additional hardware components or both. Once the required hardware is installed, the controls in the proposed invention could be implemented in a number of ways. One way is to program the control schemes onto the PLC (programmable logic controller) unit of the data center facility. Another way is to run the control algorithm on a remote computer/server which takes in the required input information from the data center components and outputs the optimum operational point.

Figure 2:
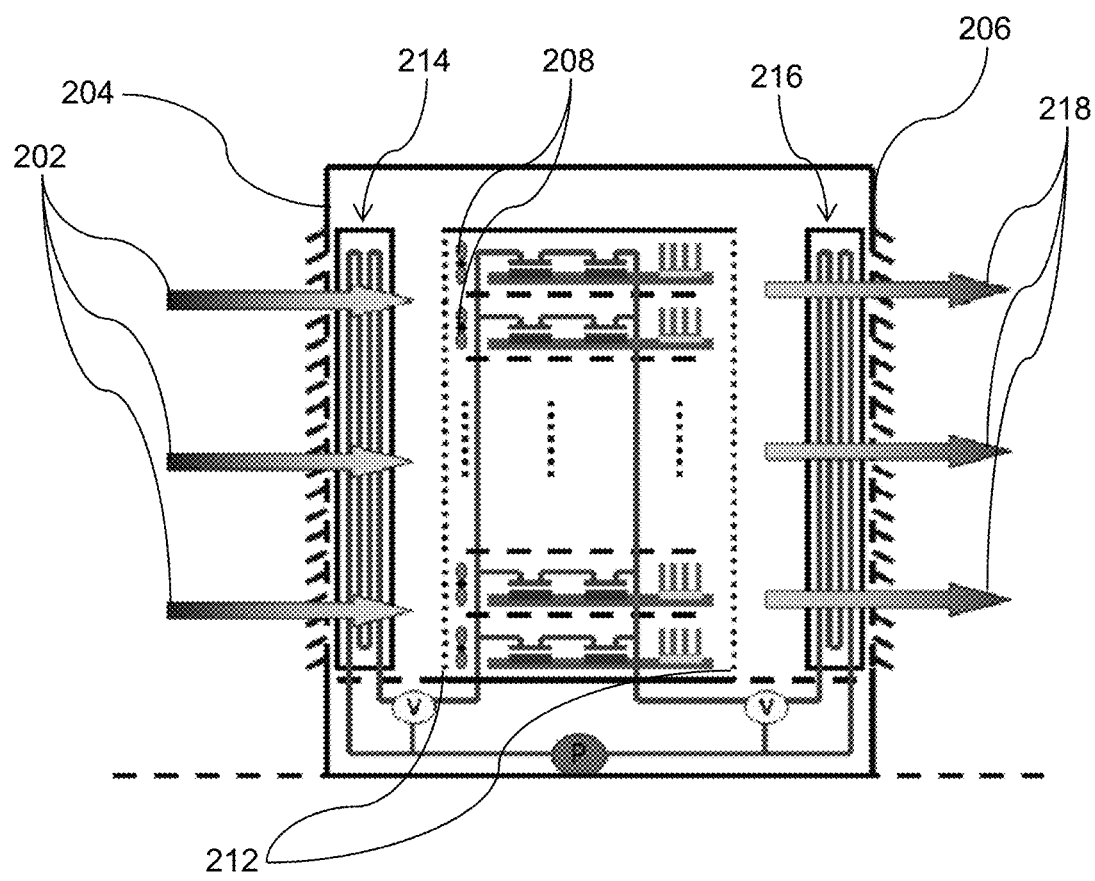
FIG. 2 shows a cross-sectional view of another embodiment of the present invention.

FIG. 2 shows a cross-sectional view of a second embodiment of the present invention. According to this embodiment the outdoor ambient air 202 would flow in through an entrance sidewall 204 and heated air 218 would exit through an exit side wall 206. The airflow is produced by fans 208 inside the server racks 210. The server rack 212 in this embodiment can have its front and rear surfaces perforated to facilitate airflow through the rack.

In this embodiment, a first heat exchanger 214 is placed next to the entrance sidewall 204 and a second heat exchanger 216 is placed next to the exit sidewall 206. The server racks are positioned in between the heat exchangers 214, 216. In one embodiment, there are no fans next to the heat exchangers. The fans in the server rack 210 thus create the airflow necessary to cool the heat exchangers.

Heated liquid exiting the server flows through the first heat exchanger 214. If the liquid is required to be cooled further it is passed through the second heat exchanger 216. Valves are used to guide the liquid through the different heat exchangers as per needed. The heat exchanger next to the second wall is optional and can be used in cases where the air temperature leaving the server is lower than the liquid temperature leaving the heat exchanger.

Figure 3:
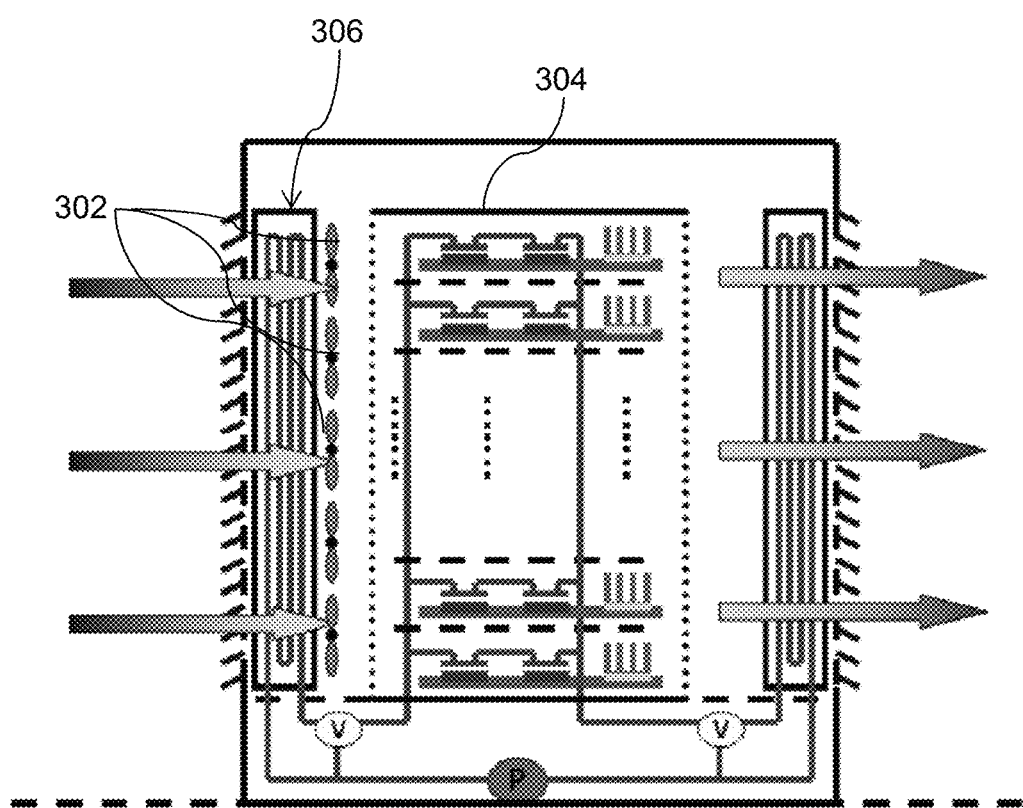
FIG. 3 shows a cross-sectional view of another embodiment of the present invention.

FIG. 3 shows a cross-sectional view of a third embodiment of the present invention. This embodiment is similar to the embodiment in FIG. 2, the difference being that the airflow is produced by fans 302 outside of the server rack 304 next to the heat exchanger 306. This allows for larger fans, having, for example, a diameter above 200 mm. Larger fans are advantageous because they create airflow more efficiently.

Figure 4:
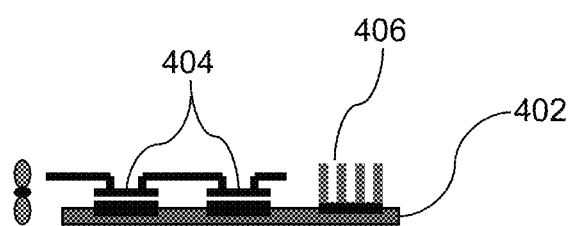
FIG. 4 shows an example cooling schematic for a server circuit board.

FIG. 4 shows an example cooling schematic for a server circuit board 402. The components 404 that generate high amount of heat are cooled by liquid coolant and the components 406 generating less heat are cooled by air with the use of heat sinks.

Figure 5:
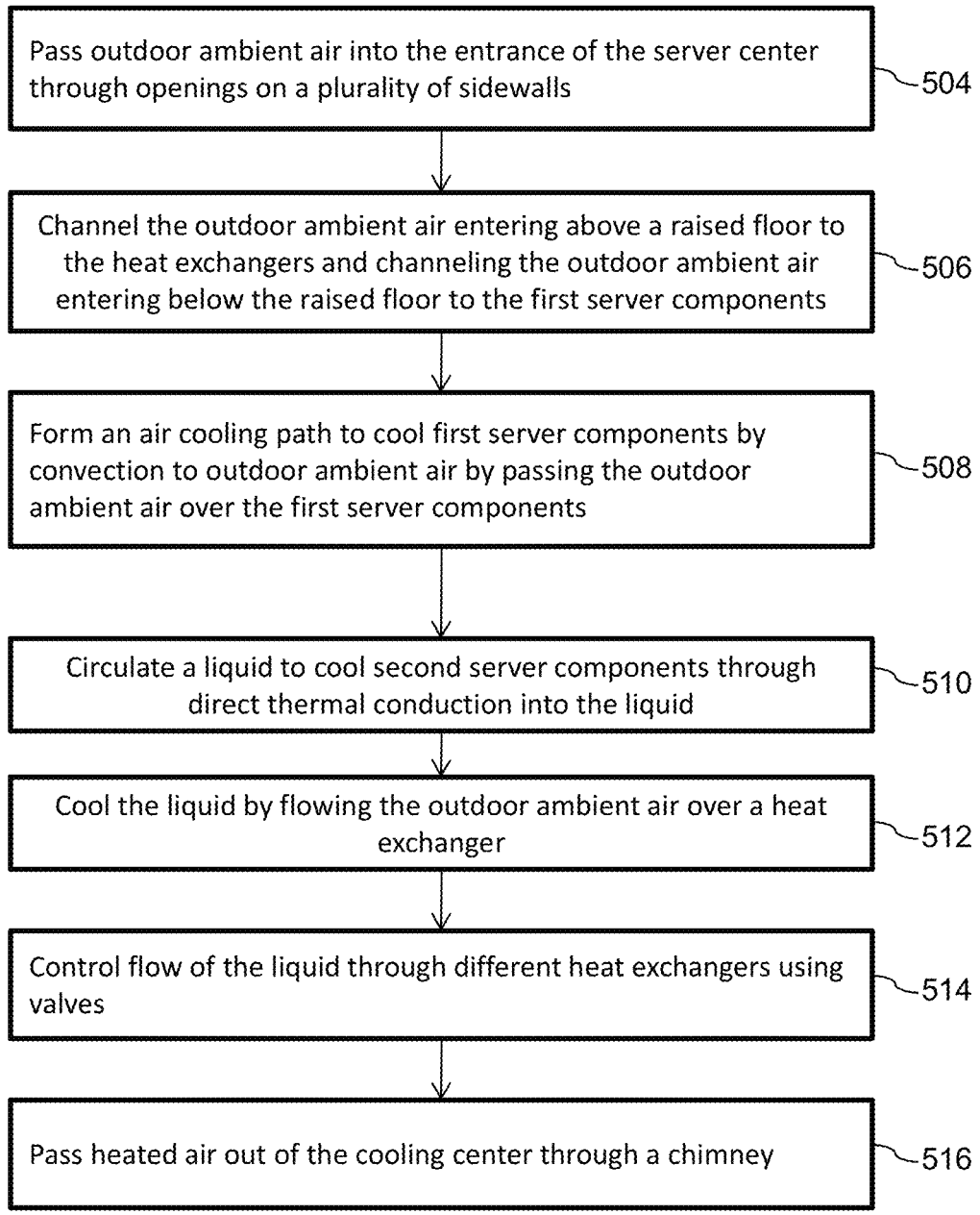
FIG. 5 shows a method for cooling server centers in accordance with one embodiment of the present invention.

FIG. 5 shows a method 502 for cooling server centers in accordance with one embodiment of the present invention. The method includes an air introduction step 504. During step 504 outdoor ambient air can be passed into the entrance of the server center through opening in the sidewalls. Airflow into the server center can be controlled by the use of louvers and air filters on the openings in the sidewalls. The louvers and air filters can also weather guard the openings to prevent unwanted substances from entering the server center. After air introduction step 504 is initiated, the method 502 continues to air channeling step 506.

At air channeling step 506, air entering the server center above a raised floor is channeled to heat exchangers and air entering the server center below the raised floor is channeled to first server components. After air channeling step 506 is initiated, the method 502 continues to forming step 508.

At forming step 508, an air cooling path is formed to direct outdoor ambient air to pass over first server components. The air cools the server components by convection to the outdoor ambient air passed over them. Heat sinks can be attached to the components to increase surface area in contact with the passing air. This will increase heat transfer from the components to the air resulting in more effective cooling. Cooling components by convection to air is a more efficient process than thermal conduction into a liquid. While more efficient, convection to air is less effective at removing heat from a component than direct thermal conduction into a liquid. Therefore, the first server components should be the components that generate the least amount of heat. After forming step 508 is initiated, the method 502 continues to liquid circulation step 510.

At liquid circulation step 510, a circulated liquid may be used to extract heat from second server components through direct thermal conduction into the liquid. This process is more effective at removing heat that by convection to air. Therefore, it is advantageous for the second set of server components to be the components that generate the most heat. After liquid circulation step 510 is initiated, the method 502 continues to step 512.

At liquid cooling step 512, the liquid heated by the second server components can be cooled by flowing outdoor ambient air over a heat exchanger containing the liquid. Outdoor ambient air previously heated by cooling other heat sinks or first server components may be used to cool the heat exchanges as long as it is colder than the liquid in the heat exchanger. After liquid cooling step 512 is initiated, the method 502 continues to flow control step 514.

At flow control step 514, valves control flow of the liquid through different heat exchanger based on the amount of cooling necessary and the temperature of the outdoor ambient air. If the outdoor ambient air is cold, the liquid coolant may only need to travel through a portion of the heat exchangers to dissipate the necessary amount of heat. Similarly, if the outdoor ambient air is hot the liquid coolant may have to run through all the heat exchanger to dissipate the necessary amount of heat. Change in server workload may cause various amounts of heat to be generated, resulting in more or less heat exchanges to be used. After flow step 514 is initiated, the method 502 continues to exhaustion step 516.

At exhaustion step 516, the air heated by the first server components and the heat exchangers may leave the server center through a chimney in the roof. In different embodiments the heated air may also leave through sidewalls or ductwork.

Embodiment of the present invention can advantageously an ambient cooled system to operate at higher outdoor ambient temperature, eliminating the need for any vapor-compression high energy refrigeration during the entire year. Liquid cooling is much more thermally efficient at removing heat components by direct thermal conduction than air cooling. However, it is not practical to have direct thermal conduction of all computer components so such systems are usually limited to high power density components such as processors and memory. Air cooling systems are easy to implement but do not provide the cooling capability of liquid cooled systems.

Systems described herein can use the air ambient environment to both provide liquid and air cooling. Conventional systems that use ambient typically use only liquid or air ambient but not both. Using the outdoor ambient for both liquid and air cooling offers significant advantages in the maximum operable outdoor ambient conditions and lower power usage even when operating at high outdoor ambient temperatures.

This is achieved by both the air loop and the liquid coolant loop having a shorter thermal resistance path from the servers to the outdoor ambient. Thus, the cooling system is highly efficient. Moreover, the air temperature as well as the liquid temperature seen by the servers can be as low as the outdoor ambient temperature or a couple of degrees Celsius above the outdoor ambient temperature.

This enables extending the server environmental from A2 (35 C) ASHRAE specifications to A3 (40 C) and A4 (45 C) ASHRAE specifications. As this system allows for higher outdoor ambient temperature operations, the cooling power can be greatly reduced when the outdoor ambient temperature is lower than the maximum design specification. Furthermore, this system enables the integration of free/ambient air cooling and free/ambient liquid cooling of data centers.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for cooling a server center comprising:
    forming an air cooling path to cool first server components by convection to outdoor ambient air by passing the outdoor ambient air over the first server components;
    circulating a liquid coolant to cool second server components through direct thermal conduction into the liquid coolant, the liquid coolant is cooled by flowing the outdoor ambient air over a heat exchanger without the use of a vapor compression refrigeration unit;
    passing the outdoor ambient air into an entrance of the server center through openings on a plurality of sidewalls, each sidewall including a first side exposed to the outdoor ambient air and second side facing the first server components and the second server components;
    passing heated air out of the server center through at least one chimney; and
    channeling the outdoor ambient air entering above a raised floor to the heat exchangers and channeling the outdoor ambient air entering below the raised floor to the first server components.

2. The method of claim 1, further comprising controlling airflow through the openings in the server center sidewalls using at least one of air filters and louvers.

3. The method of claim 1, further comprising controlling flow of the liquid through different heat exchangers using valves.

4. A computer program product for cooling a server center, the computer program product comprising:
    a computer readable storage medium having computer readable program code embodied therewith, the computer readable program code configured to:
        form an air cooling path to cool first server components by convection to outdoor ambient air by passing outdoor ambient air over the first server components; and
        circulate a liquid coolant to cool second server components through direct thermal conduction into the liquid coolant, the liquid coolant is cooled by flowing the outdoor ambient air over a heat exchanger without the use of a vapor compression refrigeration unit;
        pass the outdoor ambient air into an entrance of the server center through openings on a plurality of sidewalls, each sidewall including a first side exposed to the outdoor ambient air and second side facing the first server components and the second server components;
        pass heated air out of the server center through at least one chimney; and
        channel the outdoor ambient air entering above a raised floor to the heat exchangers and channeling the outdoor ambient air entering below the raised floor to the first server components.

5. The computer program product of claim 4, further comprising computer readable program code to control airflow through openings in the server center sidewalls using at least one of filters and louvers.

6. The computer program product of claim 4, further comprising computer readable program code to control flow of the liquid coolant through different heat exchangers using valves.

* * * * *